United States Patent [19]
Kötzle et al.

[11] Patent Number: 5,744,996
[45] Date of Patent: Apr. 28, 1998

[54] CMOS INTEGRATED SEMICONDUCTOR CIRCUIT

[75] Inventors: Gunther Kötzle, Nagold-Vollmaringen; Volker Kreuter, Korschenbroich; Thomas Ludwig, Sindelfingen; Helmut Schettler, Dettenhausen, all of Germany

[73] Assignee: International Business Machines Corporation, Armonk, N.Y.

[21] Appl. No.: 387,705

[22] PCT Filed: May 21, 1993

[86] PCT No.: PCT/DE93/00443

§ 371 Date: Jul. 17, 1995

§ 102(e) Date: Jul. 17, 1995

[87] PCT Pub. No.: WO94/01890

PCT Pub. Date: Jan. 20, 1994

[30] Foreign Application Priority Data

Jul. 1, 1992 [DE] Germany ............... 42 21 575.7

[51] Int. Cl.⁶ .................................................. H03K 3/01
[52] U.S. Cl. .............................................. 327/534; 327/536
[58] Field of Search .......................... 327/534, 535, 327/536, 537, 589, 333, 544; 326/88

[56] References Cited

U.S. PATENT DOCUMENTS

| | | | |
|---|---|---|---|
| Re. 34,797 | 11/1994 | Sato et al. | 327/534 |
| 4,115,710 | 9/1978 | Lou | 327/536 |
| 4,142,114 | 2/1979 | Green | 327/536 |
| 4,705,966 | 11/1987 | Van Zanten | 327/536 |
| 4,794,278 | 12/1988 | Vajdic | 327/536 |

OTHER PUBLICATIONS

Technical Disclosure, F.J. Aichelmann, Jr., "Low–Power Retention for CCD Memories", vol. 20, No. 11A, Apr. 1978, p. 4415–4416.

Patent Abstracts of Japan, vol. 014, No. 005 (E–869)9. Jan. 1989 & JP, A, 12 53 264 (Sharp Corp)9. Oktober. 1989, siehe Zusammenfassung.

Patent Abstracts of Japan, vol. 015, No. 254 (E–1083)27, Juni 1991 & JP, A, 30 821 151 (Nec Corp)8. Apr. 1991, siehe Zusammenfassung.

Electronics Letters, Bd. 26, Nr. 17, 16. Aug. 1990, Stevenage GB Seiten 1381 –1382, XP000108969, U. Gatti et al. "Automatic switching of substrate bias or well bias in CMOS–IC" *Das ganze Dokument*.

Patent Abstracts of Japan, vol. 013, No. 240 (E–767) 6. Jun. 1989 & JP A, 10 42 850 (NEC Corp) 15. Feb. 1989, siehe Zusammenfassung.

*Primary Examiner*—Toan Tran
*Attorney, Agent, or Firm*—James M. Leas

[57] ABSTRACT

An integrated semiconductor circuit for reducing power consumption, employing CMOS technology in which a transistor pair can be operated stably at different supply voltages. At each supply voltage the transistors have an associated threshold voltage which can be set via the well and substrate bias voltages. The substrate of the transistor pair is connected to a substrate bias voltage generator circuit and the well is connected to a well bias voltage generator circuit. An input signal representing the level of the supply voltage sets the respective bias voltages corresponding to the level of the supply voltage. Thus, the threshold voltage of each transistor is adapted to the existing supply voltage, thereby ensuring stable operation of the transistor pair. A battery driven data processing system with the integrated semiconductor circuit can attain an approximate 100 fold extension of the operating time of the battery.

9 Claims, 2 Drawing Sheets

CM OS INTEGRATED SEMICONDUCTOR CIRCUIT

FIELD OF THE INVENTION

The invention relates to an integrated semiconductor circuit employing CMOS technology and to a data processing system, both characterized by low power consumption.

BACKGROUND OF THE INVENTION

Currently available computers, and those anticipated in the near future, suffer from excessive power consumption. The problem is especially great for portable personal computers for which high power consumption is a particular disadvantage under battery operation. Large power consuming components of data processing systems include the display screen, hard disk, internal memory, processor, and other peripheral devices that may be connected. Among the known methods for extending battery life of portable computers is the "standby mode," in which the backlighting of the display screen is turned off after a period of non-use. The display screen is turned on again when the user depresses a key. The hard disk can also be halted in standby mode. Another approach for saving energy is intelligent power management in which components currently not being used are turned off, and therefore consume no power. Energy can also be saved by reducing the clock speed when lower system performance is sufficient. Still another known approach is disconnecting system power, whereby critical information for restart is saved in a special area of the processor ("rest" or "sleep mode"). In the future, systems will also save power by employing processors that operate at a supply voltage of 3.3 volts rather than the current 5 volts.

Another power saving scheme is described in, "Low-Power Data Retention for CCD Memories," by F. J. Aichelmann, Jr., in the *IBM Technical Disclosure Bulletin*, Vol. 20, No. 11A, April 1978, p. 4415. The article discloses increasing the substrate bias voltage in conjunction with a reduced refresh shift clock frequency to minimize power consumption in a charge coupled device operating on auxiliary power. The substrate bias voltage is increased to the point at which the peripheral support circuits on the CCD still operate at the minimum operating shift frequency. The load current of field effect transistors (FETs), is thereby reduced at constant drain-source voltage, resulting in lower power consumption.

Up to now, none of these approaches has been able to support sufficiently extended battery operation of portable PCs. Further improvement in conserving energy is extremely valuable and is provided by the following invention.

SUMMARY OF THE INVENTION

It is an object of the present invention to provide an integrated semiconductor circuit and a data processing system which, in addition to the currently known approaches, permits further energy saving and thus, even longer battery-based operation.

It is another object of the present invention to provide stable operation of a CMOS integrated circuit at two or more significantly different supply voltages.

It is another object of the present invention to adjust the threshold voltage of each transistor of the CMOS pair so as to provide stable operation at each supply voltage.

These and other objects of the invention are provided by a data processing system comprising an integrated semiconductor circuit including a pair of CMOS transistors, each CMOS transistor of the pair having a threshold voltage that is capable of being adjusted. A higher and a lower clock frequency is available to the integrated semiconductor circuit. A higher and a lower absolute supply voltage level is also available to the integrated semiconductor circuit. The system further comprises means to generate a signal representing the supply voltage level. The system also comprises means to automatically adjust threshold voltages of the CMOS transistors in response to the signal to provide a higher absolute threshold voltage to each CMOS transistor of the pair at the higher level and a lower absolute threshold voltage to each CMOS transistor of the pair at the lower level. The integrated semiconductor circuit is capable of stable operation at the higher clock frequency at the higher absolute supply voltage and is capable of stable operation at the lower clock frequency at the lower absolute supply voltage.

BRIEF DESCRIPTION OF THE DRAWINGS

A preferred embodiment of the present invention will now be described with reference to the accompanying drawings in which.

DETAILED DESCRIPTION OF THE INVENTION

Figure 1:
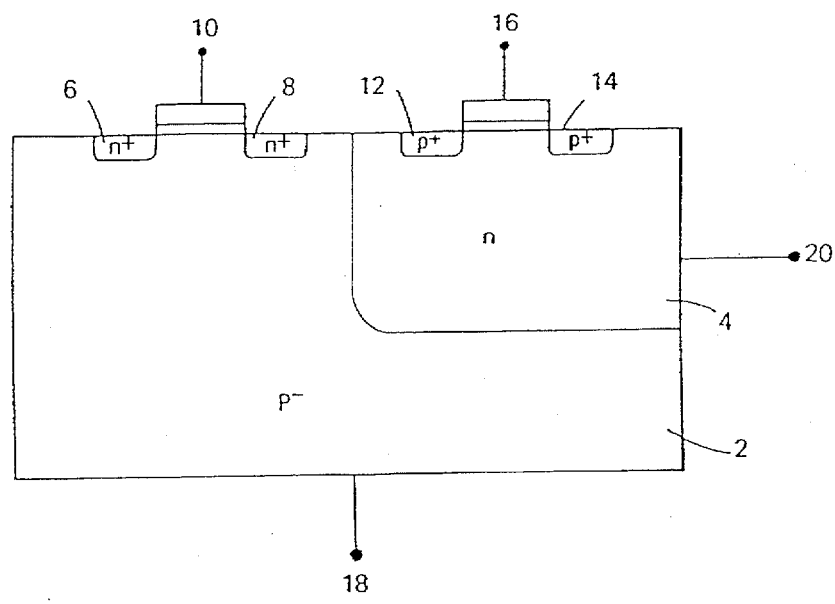
FIG. 1 shows a schematic diagram of the structure of a CMOS transistor pair.

The CMOS integrated semiconductor circuit of the present invention comprises CMOS transistor pairs to which are available a plurality of supply voltages. Of course, as many CMOS transistor pairs are formed on a semiconductor chip as can be stably operated. For each predefined supply voltage the transistors will operate at a different speed. For each supply voltage selected for transistor operation there is an associated transistor threshold voltage which is set either by a well bias voltage or by the substrate bias voltage. In typical operation in a computer, two supply voltages differing from each other significantly with respect to circuit power consumption and clock speed are provided. These are alternately switched depending on the speed required so as to save energy. It is also possible to provide intermediate voltage values. Stable operation is achieved by setting a higher absolute threshold voltage at higher supply voltage and a lower absolute threshold voltage at lower supply voltage.

Threshold voltages are adjusted by changing the substrate and well biases. Substrate and well biases are controlled with a substrate bias voltage generator circuit connected to the substrate and a well bias voltage generator circuit connected to the well of each transistor pair. These generator circuits set the respective bias voltages depending on an input signal representing the level of the supply voltage in order to adapt the threshold voltage accordingly. The input signal is preferably generated using a voltage detector which allows the most rapid setting of the new operating point, substrate and well bias, and corresponding threshold voltage as soon as the supply voltage changes. Generation of the input signal can be accomplished on the integrated semiconductor circuit or by other elements of the data processing system. For example, a voltage detector can be provided directly on the integrated semiconductor circuit or in another system unit. The supply voltage can change, for example, as a result of switching from an external power line to a battery voltage supply or by a change in an external voltage when, because of a change in current operational conditions, a lower voltage is acceptable.

It is advantageous for the supply voltages to be approximately 3.6 V for high power and 1.2 V for low power, at least in the case of integrated semiconductor circuits for portable computers. The present invention, however, is applicable to the general case where the supply voltage is reduced from a first to a second value. The reduction of the supply voltage can be by a factor of 2 or more, depending on how high the supply voltage value is.

For best results, the doping of the substrate should exhibit a concentration of $7.5 \times 10^{15}$ to $4 \times 10^{16}$ cm$^{-3}$, preferably $2.5 \times 10^{16}$ cm$^{-3}$, so that the transistors can operate stably at any desired supply voltage in the vicinity of 3.6 V and 1.2 V and at the corresponding threshold voltages.

The data processing system of the invention, such as a personal computer (PC), has at least one integrated semiconductor circuit with the aforementioned characteristics, so that more power can be conserved than with previous approaches. For portable computers, this permits considerably longer battery operation. Even under external power line operation, the invention is advantageous for the user and the environment since the data processing system operates at high voltage only when operations require it.

It is useful for the supply voltage, and thus the input signal for the bias voltage, to be selectable depending on the load on the integrated semiconductor circuit, whereby the higher supply voltage is selected automatically (under program control) only when required by the operations of the integrated semiconductor circuit. Control can also be based on the time the related input device has been idle, leading, in combination with control based on the load on the integrated semiconductor circuit, to even greater energy saving.

By providing a separate internal voltage for setting the threshold voltage, in addition to the circuit supply voltage, the integrated semiconductor circuit according to the invention enables in a simple way the creation of a data processing system that for the majority of applications is fully functional at very low voltage, without forcing the user to accept noticeable reductions in performance, but that can also be operated at full performance level. As previously mentioned, this applies particularly to portable personal computers, which, disconnected from normal line power, are operated at a battery voltage of 1.1 to 1.2 V, with resultant extended operating time, or 3.3 to 3.6 V, allowing only a relatively short operating time. (The two voltage ranges are established by arranging battery cells in parallel or in series.) Use of the integrated semiconductor circuit, even in computers that cannot be battery operated, allows an enormous energy saving, possibly rendering expensive cooling mechanisms (fans, etc.) superfluous or making their activation dependent on the load imposed on the integrated semiconductor circuit. In the PC, all semiconductor chips can be provided with the integrated semiconductor circuits according to the invention to permit optimum operation and maximum energy saving. For certain applications, chips on which only a part of the circuits are formed in accordance with the invention can be used.

Switching to the lower voltage can occur whenever the keyboard has not been used for a specified period of time. The switch can also be controlled by software that takes measurements of the load on the integrated semiconductor circuit, particularly with respect to the required clock speed, and selects the corresponding supply voltage and the associated threshold voltage accordingly.

FIG. 1 depicts the well-known structure of a CMOS transistor pair on p substrate 2 and n well 4, as well as n-doped drain and source regions 6, 8 in p substrate 2, and p-doped drain and source regions 12, 14 in n well 4. In between are corresponding gate connections 10 and 16, respectively. Substrate 2 and well 4 also have electrical connections 18 and 20.

This description applies to the n well process. In an analogous manner, it also applies to the p well process, in which the n transistor is arranged in a p well and the p transistor in the substrate, and to the twin well process, in which the p transistor is arranged in an n well and the n transistor in a p well.

Computations have shown, for example, a relative power consumption of 1 at a supply voltage of 3.6 V and a clock speed of 66 MHz. After switching to a supply voltage of 1.2 V and a clock speed of under 5 MHz, the relative power consumption is less than 0.01 and operating time of a battery-driven PC is extended about 100 times.

With the following operating values, the indicated power consumption applies:

| Vdd (V) | Frequency (MHz) | Relative Power (%) |
|---|---|---|
| 3.6 | 66 | 100 |
| 1.2 | 22 | 3.7 |
| 1.2 | 5 | 0.8 |

By reducing the supply voltage from 3.6 V to 1.2 V, power dissipation is reduced by a factor of 9. Power is also reduced proportional to the reduction in frequency.

Following is an example of the voltage values:

Vdd=positive supply voltage
Vss=negative supply voltage
VthN=threshold voltage at n transistor
VthP=threshold voltage at p transistor
Vs=substrate bias voltage
Vw=well bias voltage

| Vdd | Vss | VthN | VthP |
|---|---|---|---|
| 3.6 | GND | 0.55 | −0.55 |
| 1.2 | GND | 0.3 | −0.3 | and the variable well and substrate bias voltages are

| Vdd (V) | Vs (V) | Vw |
|---|---|---|
| 3.6 | −0.7 | Vdd + 0.7 V |
| 1.2 | Vss | Vdd |

The voltages on the chip are then:

| Vdd | Vss | n well | p substrate | source (P) | source (N) |
|---|---|---|---|---|---|
| 3.6 | 0 | 4.3 | −0.7 | 3.6 | 0.0 |
| 1.2 | 0 | 1.2 | 0.0 | 1.2 | 0.0 |

Figure 2:
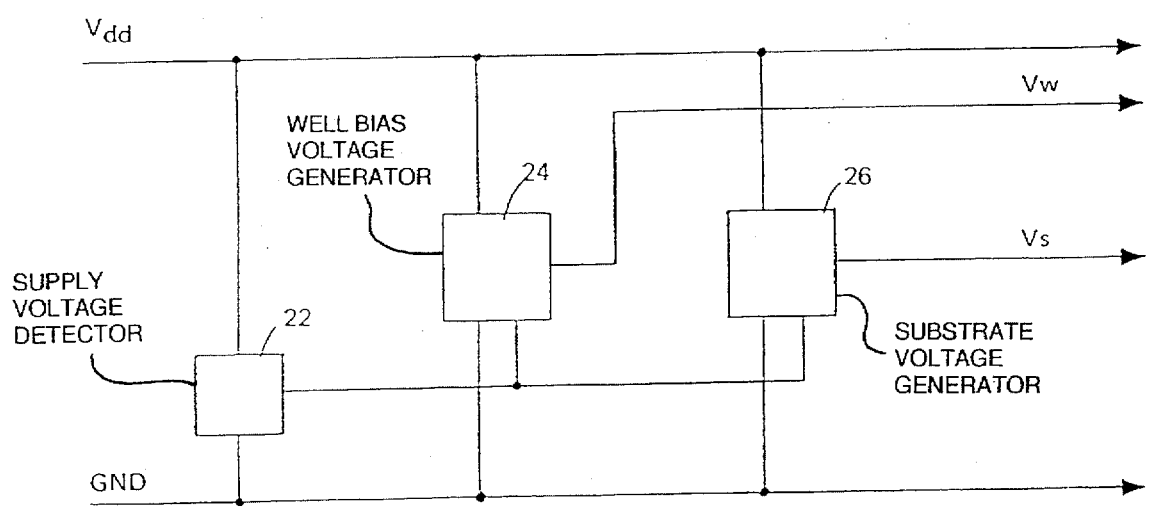
FIG. 2 is a block schematic for providing the bias voltages.

FIG. 2 shows in a block schematic, for purposes of example, voltage detector (SD) 22, which can be provided either on the respective semiconductor chip or elsewhere and which generates an input signal for bias voltage generators 24 and 26 depending on the existing supply voltage Vdd. Well bias voltage generator (WVG) 24 then generates a corresponding output voltage Vw for the well, and substrate bias voltage generator (SVG) 26 a corresponding voltage Vs for the substrate. In a PC, these voltages can, of course, be provided once for all applicable semiconductor chips, with appropriate voltage distribution systems and appropriately doped CMOS transistor pairs.

Figure 3:
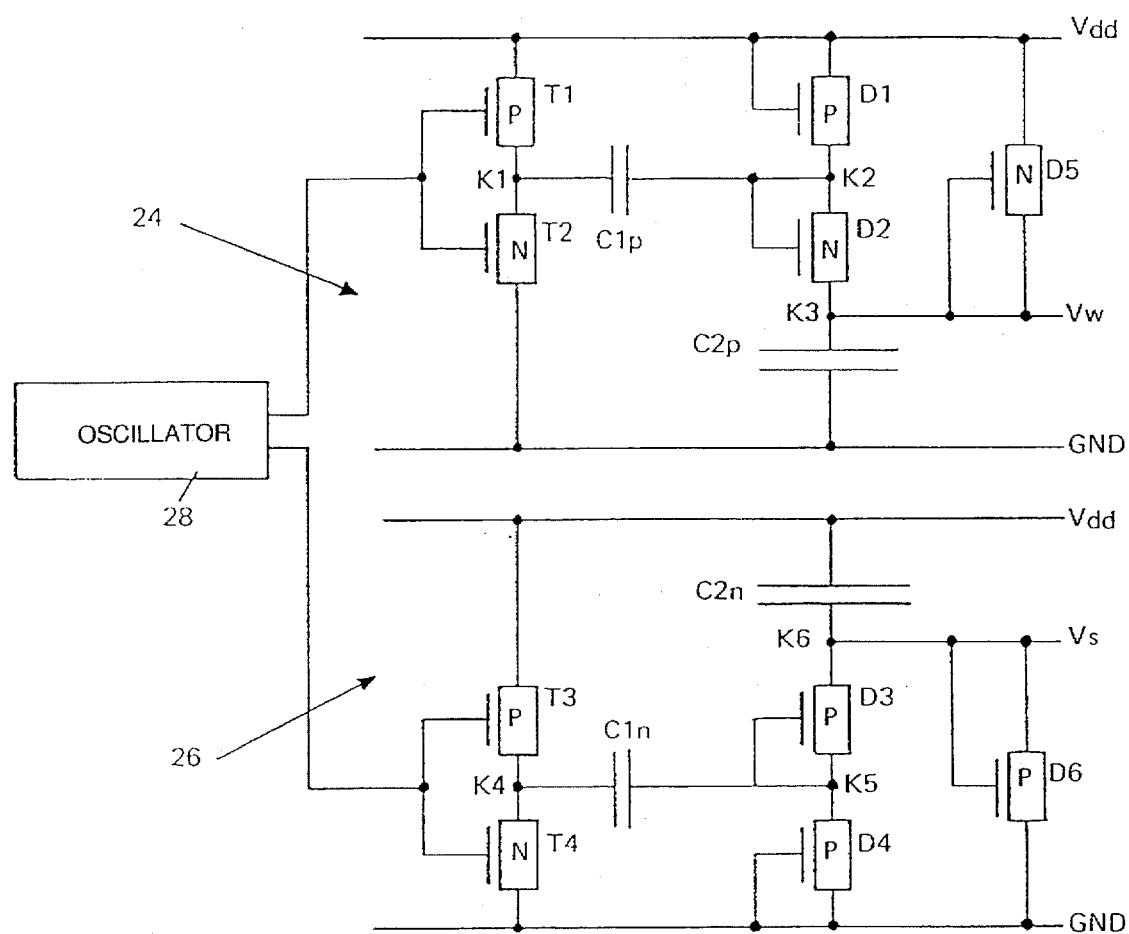
FIG. 3 shows the bias voltage generator circuits for generating the respective bias voltages.

FIG. 3 shows an example of circuitry for the CMOS bias voltage generators 24 and 26. In the well bias voltage generator circuit, complementary transistors T1 and T2 are connected in series between the supply voltage Vdd and GND, whereby p transistor T1 is connected to Vdd and n transistor T2 to GND. The two gates of the transistors are connected to ring oscillator 28, which provides pulses in a wide frequency range corresponding to the dimensioning of the circuits (preferred range 1 MHz to 100 MHz). Also connected in series between Vdd and GND are n transistor D1 connected as a diode, whose gate is also connected to Vdd, another n transistor D2 connected as a diode, whose gate is connected to common node K2 between the transistors, and capacitor C2$p$. The common point K1 between transistors T1 and T2 is connected to point K2 via capacitor C1$p$. Between node K3, between transistor D2 and capacitor C2$p$, and Vdd, there is an additional n transistor D5 connected as a diode, whose gate is at the potential of node K3. The potential of node K3 supplies the well bias voltage Vw.

The circuit for substrate bias voltage generator 26 is constructed similarly. Corresponding to transistors T1 and T2 are transistors T3 and T4, whose gates are connected to ring oscillator 28, connected in series between Vdd and GND. In series between Vdd and GND are capacitor C2$n$ and two p transistors D3 and D4 connected as diodes, whose gates are connected to node K5 between the two transistors and GND, respectively. Node K4 between transistors T3 and T4 is connected to node K5 via capacitor C1$n$. Similarly, node K6 between capacitor C2$n$ and transistor D3 is connected to GND via p transistor D6 connected as a diode, whose gate is also at the potential of node K6. The potential of node K6 represents the substrate bias voltage Vs.

The circuit of well bias voltage generator 24 functions such that, via ring oscillator 28, a series of square-wave pulses are applied to the gates of transistors T1 and T2. On the positive-going edge, transistor T2 turns on, and the supply voltage Vdd, minus the voltage drop across transistor T2 and D1, is applied to capacitor C1$p$. On the negative-going edge, transistor T1 turns on, and the charge on capacitor C1$p$ is transferred in part to capacitor C2$p$. The voltage at node K2 (VK2) and thus the voltage across C2$p$ can thereby attain values exceeding Vdd (theoretically: VK2≅2 Vdd). However, capacitor C1$p$ must first be recharged, so that the voltage across capacitor C2$p$ is reduced by the voltage drops across transistors T1 and D2. With each pulse, capacitor C2$p$ is charged to a higher level, but, due to diode-acting transistor D5, the voltage across capacitor C2$p$ and thus the output voltage for the well is limited to a voltage increased by the diode forward voltage.

The circuit for the substrate bias voltage functions in an analogous manner. On the positive-going edge, transistor T4 conducts, and capacitor C2$n$ is charged to a voltage corresponding to the capacitance of the voltage divider formed by capacitors C1$n$ and C2$n$ minus the voltage drops across transistors T4 and D3. After T3 turns on as a result of the negative-going edge of the square-wave pulse, the capacitor is recharged to at most the reduced supply voltage Vdd minus the voltage drops across transistors T3 and D4. With the next positive-going pulse, transistor T4 conducts again, and node K4 and simultaneously the electrode of capacitor C1$n$ are thereby set to GND potential. With the bias voltage of capacitor C1$n$ from the previous pulse, the potential of node KS is set negative until transistor D3 conducts and the charge on capacitor C1$n$ has been distributed across capacitors C1$n$ and C2$n$ according to their capacitances. Node K6 and thus substrate bias voltage Vs thereby go negative. After a certain time, voltage Vs attains a final value, which is limited by transistor D6.

Selection of components, in particular the capacitors, is driven by the output voltage requirements and the desired times for the final value to take effect. This selection can easily be made by those skilled in the art, or they are defined by the chip size and layout. Sample values for the capacitors are:

C1$p$=5 pF

C2$p$=5 nF

C1$n$=5 pF, and

C2$n$=5 nF

While an embodiment of the invention has been described in detail herein and illustrated in the accompanying drawings, it will be evident that various modifications are possible without departing from the scope of the invention. Nothing in the above specification is intended to limit the invention more narrowly than the appended claims. The examples given are intended only to be illustrative rather than exclusive.

What is claimed is:

1. A data processing system, comprising:

an integrated semiconductor circuit including a CMOS pair of transistors, each transistor of said pair having an adjustable threshold voltage;

a variable frequency clock connected to said integrated semiconductor circuit;

both a higher and a lower absolute supply voltage level available for connection to said integrated semiconductor circuit, wherein one of said higher and said lower supply voltage levels is connected to said circuit at a time;

detecting means coupled to the supply voltage level that is connected to said circuit to generate a signal representing the supply voltage level that is connected to said circuit;

means to automatically adjust threshold voltages of said transistors in response to said signal to provide a higher absolute threshold voltage to each transistor of said CMOS pair at said higher level and a lower absolute threshold voltage to each transistor of said CMOS pair at said lower level; and wherein said integrated semiconductor circuit has stable operation at a higher clock frequency at said higher absolute supply voltage and has stable operation at a lower clock frequency at said lower absolute supply voltage, wherein one of said higher clock frequency and said lower clock frequency is connected to said circuit at a time.

2. A data processing system as recited in claim 1, wherein said integrated circuit saves power as a result of operating both at low supply voltage and at low frequency.

3. A data processing system as recited in claim 1, wherein said higher supply voltage is approximately 3.3 to 3.6 V and said lower supply voltage is approximately 1.1 to 1.2 V.

4. A data processing system as recited in claim 1, wherein said means to automatically adjust threshold voltages comprises bias voltage generator circuits for a substrate and for a well of said CMOS transistor pair.

5. A data processing system as recited in claim 1, wherein said means to automatically adjust threshold voltages comprises bias voltage generator circuits for each of twin wells of said CMOS transistor pair.

6. A data processing system as recited in claim 1, wherein said detecting means comprises a voltage detector, said voltage detector being connected to receive said supply voltage level connected to said circuit.

7. A data processing system as recited in claim 1, wherein said supply voltage level is selectable as a function of load on said integrated semiconductor circuit.

8. A data processing system as recited in claim 1, wherein said supply voltage level depends on the time an input device has been idle.

9. A data processing system as recited in claim 1, wherein said integrated semiconductor circuit comprises a substrate and said substrate is doped with ions below the surface with a concentration of approximately $7.5 \times 10^{15}$ cm$^{-3}$ to approximately $4 \times 10^{16}$ cm$^{-3}$.

* * * * *